(12) United States Patent  
Gorgy et al.

(10) Patent No.: US 10,901,455 B2  
(45) Date of Patent: Jan. 26, 2021

(54) TIME ARBITRATION CIRCUIT

(71) Applicant: SCPTIME, La Mure d'Isere (FR)

(72) Inventors: Maurice Gorgy, Seyssinet Pariset (FR); Jean-Luc Mazoyer, Notre Dame des Commiers (FR); Nicolas Gorgy, Ponsonnas (FR); Fabrice Guery, Saint Georges de Commiers (FR)

(73) Assignee: SCPTIME, La Mure d'Isere (FR)

( * ) Notice: Subject to any disclaimer, the term of this patent is extended or adjusted under 35 U.S.C. 154(b) by 87 days.

(21) Appl. No.: 16/306,442

(22) PCT Filed: May 31, 2017

(86) PCT No.: PCT/FR2017/051370  
§ 371 (c)(1),  
(2) Date: Nov. 30, 2018

(87) PCT Pub. No.: WO2017/207932  
PCT Pub. Date: Dec. 7, 2017

(65) Prior Publication Data  
US 2020/0125134 A1 Apr. 23, 2020

(30) Foreign Application Priority Data

May 31, 2016 (FR) .................................... 16 70278

(51) Int. Cl.  
*G06F 1/12* (2006.01)  
*G06F 13/42* (2006.01)  
*H04L 5/00* (2006.01)  
*H04L 7/00* (2006.01)  
*G06F 1/08* (2006.01)  
*G06F 1/10* (2006.01)  
(Continued)

(52) U.S. Cl.  
CPC .................. *G06F 1/12* (2013.01); *G06F 1/08* (2013.01); *G06F 1/10* (2013.01); *G06F 1/14* (2013.01); *H03K 5/135* (2013.01)

(58) Field of Classification Search  
CPC ..... G06F 1/12; G06F 1/08; G06F 1/10; G06F 1/14; H03K 5/135; H03L 7/097  
See application file for complete search history.

(56) References Cited

U.S. PATENT DOCUMENTS 6,466,635 B1 10/2002 Stroeble  
2009/0085630 A1* 4/2009 Haralabidis ............ H03K 5/156  
327/299

FOREIGN PATENT DOCUMENTS

EP 2 187 619 A1 5/2010

* cited by examiner

*Primary Examiner* — Xuxing Chen  
(74) *Attorney, Agent, or Firm* — Oliff PLC

(57) ABSTRACT

A time arbitration circuit includes: a comparator including at least first and second inputs and configured to provide at least a first data item relative to the synchronization status of the signals present on the first and second inputs; a clock signal generator connected to an output terminal of the time arbitration circuit and delivering an output clock signal; a control circuit configured to enable or disable delivery of the output clock signal on the output terminal according to the first data item from the comparator and to possibly deliver data relative to the synchronization status according to the first data item; the first and second inputs of the comparator are connected to first and second input terminals of the time arbitration circuit designed to be connected to first and second sources delivering first and second clock signals.

19 Claims, 3 Drawing Sheets

(51) Int. Cl.
*G06F 1/14* (2006.01)
*H03K 5/135* (2006.01)

TIME ARBITRATION CIRCUIT

FIELD OF THE INVENTION

The invention relates to a time arbitration circuit delivering a clock signal.

STATE OF THE ART

A large number of electronic devices currently comprise a time base which defines the time within the electronic device via a time code for example. This time base is, however, not perfect in particular as far as its exactitude is concerned. Depending on the quality of the time base, the latter may drift several seconds per day in random manner, for example according to weather conditions and/or vibrations in its nearby environment. This point does not give rise to any real problem if the drift is small and provided the electronic device remains autonomous and isolated.

In a computer network on the other hand, it is particularly important to ensure synchronization of the time bases of the different computing systems which communicate with one another. A good time management is in particular useful or even vital for management of transactions in databases or more generally for monitoring actions in the computer network. This is why, in a large number of computer networks, the time is fixed by a signal which imposes a reference "network time".

In numerous fields of activity, it is necessary to have a clock signal which is secured in order to ensure that the different actions performed are compliant with correct operation of a structure, a profession or an organisation.

This secured clock signal is extremely important for securing a computer network or a time code distribution system present on a national or local territory. In this way, several different entities can interact with one another while being able to know chronologically which actions have been performed. It has also proved very important to master time distribution for example in the field of air traffic control, rail transport, banking transaction security or in management of infrastructures related to electric power transmission.

This secured clock signal can be used to advantage in distribution of a reference time which can for example be in the form of a time representative of a legal time. Legal time is defined by a strictly defined piece of equipment, for example an observatory, and it is advantageous to distribute a reference time, in secured manner, from this legal time.

In order to guarantee a certain security level, it is important for the transmitted time to be verified to identify risks of malfunctioning of one of the components involved in providing a reference or to detect possible malevolent action.

OBJECT OF THE INVENTION

One object of the invention consists in remedying these shortcomings, and in providing a time arbitration circuit which makes it possible to ensure that a more secured clock signal is delivered.

For this purpose, the time arbitration circuit comprises:
  a comparator comprising at least first and second inputs and configured to provide at least one data item relative to the synchronization status of the signals present on the first and second inputs,
  a clock signal generator connected to an output terminal of the arbitration circuit and delivering an output clock signal,
  a control circuit configured to enable or disable delivery of the output clock signal on the output terminal according to the first data item from the comparator and/or to deliver data relative to the synchronization status according to the first data item,
  the first input of the comparator is connected to a first input terminal of the arbitration circuit designed to be connected to a first source delivering a first clock signal,
  the second input of the comparator is designed to be connected to a second source delivering a second clock signal.

BRIEF DESCRIPTION OF THE DRAWINGS

Other advantages and features will become more clearly apparent from the following description of particular embodiments of the invention given for non-restrictive example purposes only, and represented in the appended drawings, in which.

DESCRIPTION OF A PREFERRED EMBODIMENT OF THE INVENTION

Figure 1:
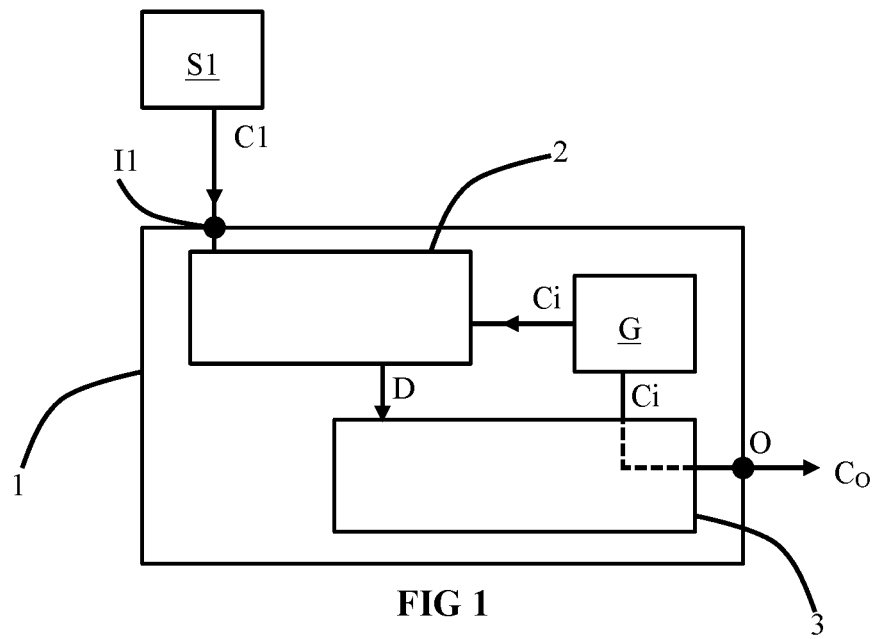
FIG. 1 illustrates an embodiment of a time arbitration circuit with an external synchronization source and an internal synchronization source, in schematic manner.

As illustrated in FIGS. 1 to 6, the time arbitration circuit 1 comprises a comparator 2 provided with at least first and second inputs. The comparator 2 is configured to compare the signals applied on the different inputs, for example the first, second and, if applicable, third inputs, and to provide a first data item D representative of the synchronization status between the signals present on the different inputs.

The comparator 2 enables the different time signals applied on input to be compared in order to detect whether the latter are synchronized or not. If the signals are synchronized, the arbitration circuit 1 can conclude that the sources are operating perfectly and that transmission of the signal is correct. If on the other hand at least one of the signals is desynchronized, the arbitration circuit can conclude that one of the sources presents a malfunction or is the target of malevolent action.

The clock signal on input and/or on output can be represented in the form of a time code or of a time protocol. The clock signal to be analysed can be composed of a first signal called TOD standing for Time Of Day and a second signal called PPS standing for Pulse Per Second. Comparison of the signals can be broken down into two comparisons for each of the components. However, the criticality linked to the first signal is lower than that linked to the second signal as an inconsistency and/or a deviation are easier to detect. The signal called PPS can be used to define the precision of the arbitration circuit. Detection of a drift can be performed for example on the basis of a rising edge.

When the clock signal comprises several components, it is advantageous to provide a comparator configured to provide a first data item D which includes data on synchronization of each of the components or of one or more of the components of the different signals to be compared.

The time arbitration circuit 1 comprises a clock signal generator G. The clock signal generator G will provide an output clock signal $C_O$ to an output terminal O of the time arbitration circuit 1. The clock signal generator G is internal to the time arbitration circuit 1 which enables it to be protected against malevolent action. The quality of the clock signal generator G defines its level of performance and in particular the quality of the signal $C_O$ delivered by the time arbitration circuit, for example the quality of the time provided by the circuit 1.

In a privileged embodiment, the clock signal generator G is formed by a quartz oscillator, for example a quartz oscillator of TCXO type or a quartz oscillator of OCXO type. As a variant, the generator can be formed by an atomic micro-oscillator, preferably made from a rubidium or a caesium atomic micro-oscillator.

TCXO quartz oscillators are temperature-compensated oscillators thereby ensuring the frequency stability even if the temperature of the outside medium varies. Frequency stability is obtained by monitoring the operating temperature of the electronic quartz oscillator according to the outside temperature. The operating range of such an oscillator is comprised between −20° C. and 70° C. The frequency stability of such an oscillator is in the range of a few ppm.

OCXO quartz oscillators are oven-controlled oscillators which are configured to deliver a fixed and regulated temperature to the oscillator. In this way, the oscillator is insulated from variations of the external medium which enables frequency variations linked to the variations of the outside temperature to be reduced or even eliminated. The operating range of such an oscillator is comprised between −20° C. and 70° C. The frequency stability of such an oscillator is about a few $10^{-8}$ or even a few $10^{-9}$ for devices presenting the best performances.

Atomic micro-oscillators for their part use almost unvarying physical properties of certain chemical elements in order to generate clock signals at a very stable frequency. The atomic micro-oscillator can be made from a rubidium or a caesium atomic micro-oscillator. The operating range of such an oscillator is comprised between −40° C. and 80° C. The minimum frequency stability of such an oscillator is about a few $10^{-10}$ or a few $10^{-12}$ for the devices presenting the best performances.

As a variant, it is also possible to use an oscillator having less good performances than those set out above. It is then necessary to synchronize this oscillator on a reference signal in regular manner. The quality of the generator G is advantageously linked to the performance required on the signal $C_O$. A decrease of the performances of the generator G can be envisaged depending on the user's requirements.

The clock signal generator G will deliver the clock signal Ci on output O of the arbitration circuit 1. This clock signal is delivered with a high level of reliability as it originates from a generator which is internal to the arbitration circuit 1. The quality of the clock signal generator is defined according to the user's requirements, i.e. according to the constraints imposed on the acceptable drift, for a fixed time period, when the generator G is not servo-controlled to or synchronized with another source S. In advantageous manner, the generator G presents a level of performance at least equal to the level of the minimum performance of the external synchronization sources.

The time arbitration circuit 1 further comprises a control circuit 3. The control circuit 3 receives the first data item D from the comparator 2 on input. The control circuit 3 can be configured to enable or disable delivery of the output clock signal $C_O$ originating from the clock signal generator G according to the status of the first data item D. The control circuit 3 can also deliver data to the user in addition to or instead of the signal $C_O$. This data is dependent on the first data item D provided by the comparator 2 even if the control circuit 3 has decided to enable or disable delivery of the output clock signal $C_O$.

The control circuit 3 can be formed by a microcontroller, a programmable logic circuit (for example of field programmable gate array (FPGA) type) or by a hard-wired logic device.

In a particular embodiment, the control circuit 3 comprises a switch connected between the output of the clock signal generator G and the output of the arbitration circuit so as to enable or disable delivery of the output clock signal $C_O$. The control circuit 3 enables or disables delivery of the output clock signal according to data provided by the comparator 2. In other words, the signal $C_O$ is equal to the signal Ci or it is zero. As a variant, the signal $C_O$ can also include other data, for example indications on the operating mode of the arbitration circuit, on the status of the synchronization signals, and in particular indications explaining that the circuit 1 is operating in uncertain mode as one of its synchronization sources is not synchronized.

It is particularly advantageous to provide for the first data item D to be obtained by means of measurement of a time difference between the signal applied on the first input of the comparator 2 and the signal applied on the second input of the comparator 2. The comparator 2 is therefore configured to measure the time difference between the signals applied on its first and second inputs. This time difference is typically about a fraction of a second. If the signal comprises several components, the comparator 2 can be configured to measure the time difference for several components or for each of the components.

As a variant which can be combined with the previous embodiment, the comparator 2 or the control circuit 3 can be configured to calculate the variation of the time difference or the rate at which the time difference varies over a predefined time period.

The first signal source S1 can be formed in different ways and for example by a unidirectional source. In a first embodiment, the first source is a satellite synchronization source and the time arbitration circuit is connected, via its first input I1, to a receiver of Global Navigation Satellite System (GNSS) type. Depending on the embodiments, the receiver can use a single satellite positioning system such as the GPS, GLONASS, GALILEO or BEIDU systems. As a variant, it is possible to provide for the receiver to be able to simultaneously use several satellite positioning systems from among those referred to above. In advantageous manner, the arbitration circuit is synchronized on a signal originating from one or more satellites.

In another embodiment, the first source S1 is a Network Time Protocol (NTP). This protocol delivers a reference time which enables a clock to be synchronized from a reference server. This synchronization signal C1 is applied on the first input I1.

In another embodiment, the first source S1 is a Precision Time Protocol (PTP). This protocol constitutes a variant of the previous protocol. This protocol is established according to the principle of master clock and slave clocks. The master clock acting as time reference is called "reference clock".

Its time is synchronized (via GPS, NTP, etc.) on the clock called global clock. This synchronization signal C1 is applied on the first input I1.

In yet another embodiment, the first source S1 is again an electronic signal originating from an atomic clock.

It is further possible to provide for the first source S1 to be a source which emits a signal by radio waves, for example a time signal by radio waves.

For example purposes, the control circuit 3 can be configured to allow a deviation of 1% between the signals applied on the first and second inputs over a period of one hour. If the comparator detects that the deviation is less than 1%, it considers the signals to be synchronized. If on the other hand the control circuit 3 detects that the deviation is greater than 1%, the signals are considered to be desynchronized and an action is performed by the control circuit 3. The signals are considered to be desynchronized as the drift of one signal with respect to the other takes place very quickly even if in absolute value the time shift has not yet reached a previously defined threshold value.

In advantageous manner, if the drift of one signal with respect to the other is very fast, the control circuit 3 is configured to engage an action, for example to send data on the drift or the drift rate of the signals and/or to prevent synchronization of the signal generator G with respect to one of the synchronization sources which are applied on input. The control circuit 3 is also configured to monitor the variation of the deviation between the first and second sources over a predefined time period. If at the end of the predefined time period, the control circuit considers that the drift rate is too high, the clock signal generator G is kept non servo-controlled mode.

In a particular embodiment illustrated in FIG. 1, the clock signal generator G is connected to the second input of the comparator 2. The comparator 2 emits a first data item D representative of synchronization between the signal present on its first input and the signal emitted by the signal generator G.

Using the clock signal generator G as a synchronization source acts as a safety feature. The clock signal generator G is in fact a known element with performances which are well mastered. As the signal generator G is internal to the arbitration circuit 1, it is protected from numerous external disturbances and in particular from malevolent disturbances.

In advantageous manner, the control circuit 3 is configured to disable delivery of the output signal $C_O$ when the comparator 2 detects that the signal present on the first input I1 is no longer synchronized with the clock signal Ci emitted by the generator G and applied on the second input The control circuit 3 can be configured so as to disable delivery of the output clock signal when the time difference between the signal present on the first input I1 compared with the signal emitted by the generator G reaches a threshold value and/or if the drift rate of the time difference reaches a threshold value.

In this configuration with a single external synchronization source, the time arbitration circuit 1 cannot determine whether the absence of synchronization is due to a deviation of the signal emitted by the generator G or to a deviation of the signal emitted by the first source S1. To prevent delivery of a clock signal $C_O$ which may be corrupted, the time arbitration circuit 1 disables delivery of the output clock signal. As a less advantageous alternative, it is possible to enable delivery of the signal $C_O$ during a predefined period indicating to the user that the output signal $C_O$ is degraded. It is also possible to combine these two embodiments with one another.

This particular configuration with an external source and an internal source is not optimal as it does not enable delivery of a secured output signal during a long period of time. It is not advantageous to synchronize the generator G on the external source as a slow drift of the external source can be reflected in the generator.

However, this configuration may nevertheless appear attractive as it can be used as downgraded operating mode for certain of the embodiments that follow when an external synchronization source has been excluded.

Figure 2:
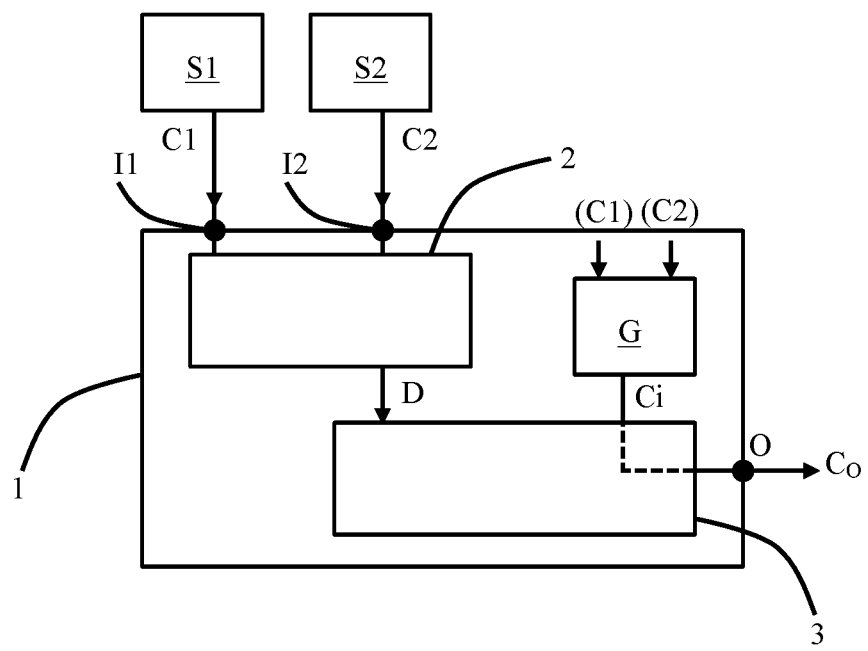
FIG. 2 illustrates an embodiment of a time arbitration circuit with two external synchronization sources, in schematic manner.

In another embodiment illustrated in FIG. 2, the first and second inputs of the comparator 2 are respectively connected to first and second inputs I1 and I2 of the time arbitration circuit 1. The first and second inputs I1 and I2 of the arbitration circuit are themselves connected to first and second sources S1 and S2 configured to generate first and second clock signals C1 and C2. The first source S1 is distinct from the second source S2. The first and second sources S1 and S2 are distinct from the clock signal generator G.

The first and second sources S1 and S2 can be chosen from the sources presented for the previous embodiment. Sources S1 and S2 can be external sources as indicated previously or, as a variant, one of the sources is an internal generator which is distinct from the generator G.

As in the previous embodiment, the comparator 2 is configured to detect whether the signals C1 and C2 present on the first and second inputs are synchronized or not. The comparator 2 will emit a first data item D representative of this synchronization. Depending on this data, the control circuit 3 will enable or disable delivery of the output clock signal $C_O$ emitted from the signal generator G and/or deliver data relative to the operating status of the arbitration circuit.

In a particular embodiment, the generator G is not servo-controlled to the first source S1 or to the second source S2, whether the signals C1 and C2 are synchronized or not.

It is particularly advantageous to provide for the control circuit 3 to enable synchronization of the generator G with the signal emitted by the first source S1 or with the signal emitted by the second source S2 when the latter are synchronized. This configuration enables the generator G to be recalibrated over large time periods. It is also advantageous to provide for the control circuit 3 to prevent synchronization of the generator G by means of the first and second signals C1 and C2 when the latter are desynchronized. The generator G is then in a non servo-controlled mode, also referred to as "hold over".

This embodiment is more advantageous than the previous embodiment, as the two external synchronization sources enable the generator G to be synchronized when the external sources are synchronized with one another. It is therefore possible to monitor and correct a drift of the generator G.

Figure 3:
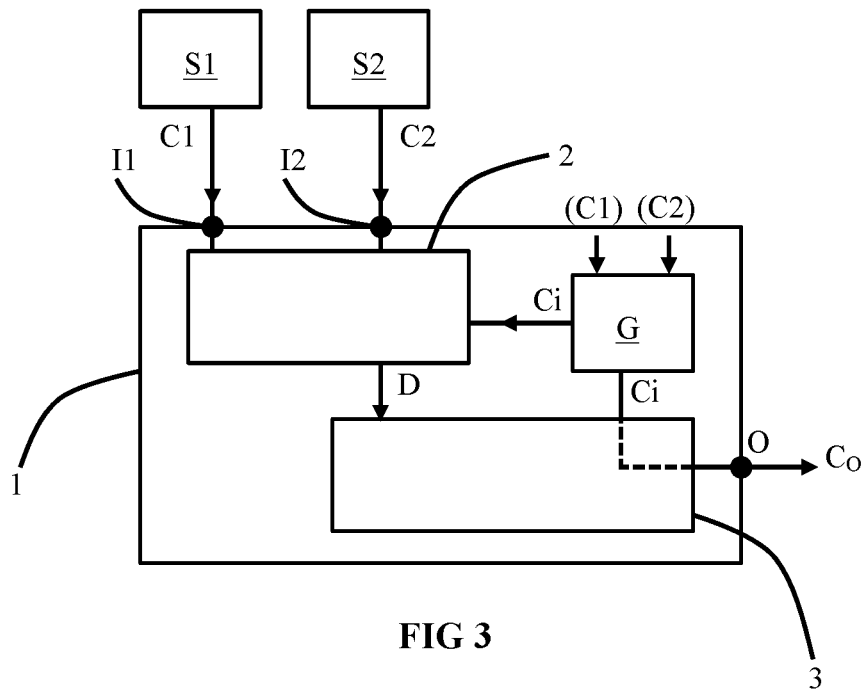
FIG. 3 illustrates an embodiment of a time arbitration circuit with two external synchronization sources and an internal synchronization source, in schematic manner.

In another embodiment illustrated in FIG. 3, the comparator 2 comprises first, second and third inputs. The first and second inputs are respectively connected to distinct first and second sources S1 and S2 which generate first and second clock signals C1 and C2. The sources are advantageously external sources.

The third input of the comparator 2 is connected to the signal generator G which acts as third signal source, an internal synchronization source. The comparator 2 is configured to deliver first data on the synchronization status of the different signals present on its first, second and third inputs.

As for the embodiment illustrated in FIG. 2, the signal generator G can be servo-controlled by means of the signals C1 and C2 under particular conditions or it can be in non servo controlled mode even when the signals C1 and C2 are synchronized.

Figure 4:
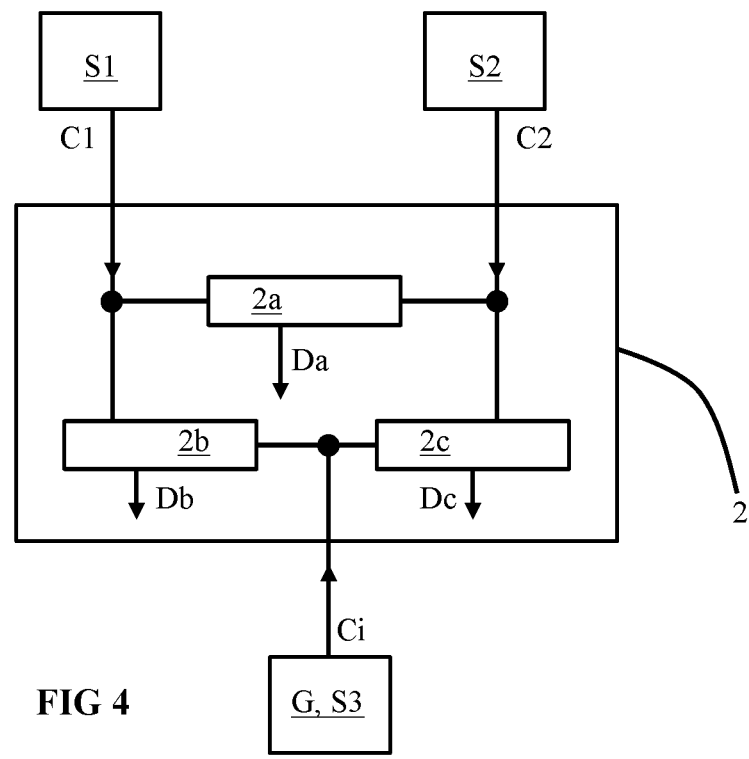
FIG. 4 illustrates a particular embodiment of a comparator, in schematic manner.

In a particular embodiment illustrated in FIG. 4, the comparator 2 is divided into elementary comparators so as to be able to measure the synchronization of several different pairs of signals. In the illustrated example, the comparator 2 is formed by three elementary comparators 2a, 2b and 2c. The comparator 2a is configured to measure the synchronization between the signals present on its first and second inputs. The comparator is also configured to measure the synchronization between the signals present on the second and third inputs separately by means of the comparator 2c. The comparator is further configured to measure the synchronization between the signals present on the first and third inputs by means of the comparator 2b. In this particular exemplary case, all the signals are compared two by two in order to detect the presence or absence of a synchronization between the different signals. This regulation mode is particularly robust as it enables a synchronization fault in one of the signals to be rapidly detected. Each of the elementary comparators returns specific data which forms a part of the first data item D.

In advantageous manner, the comparator 2 is configured to measure a time difference between the signals present on its first and second inputs. It is also advantageous to provide for the comparator 2 to be configured to measure a time difference between the signals present on its second and third inputs and on its first and third inputs. The first data item D is emitted by means of the different values of the time differences, in this case three time differences. In an advantageous embodiment, the time differences are compared and the comparator 2 only retains the highest value in absolute value. In another embodiment, the three data items (Da, Db and Dc) are sent to the control circuit 3.

In another embodiment (not represented), not all the signals are compared two by two. One of the three signals is considered as being a reference signal and the other two signals are compared with this reference signal. It is then possible to check that the three signals are synchronized by comparing the different measured time differences. In advantageous manner, the reference signal is defined by the internal generator, for example signal generator G. This embodiment is more compact and less power-consuming, as one elementary comparator has disappeared, for example elementary comparator 2a.

As in the previous embodiment, the control circuit 3 is configured to enable synchronization of the signal generator G by means of the signal present on the first input or by means of the signal present on the second input, if these signals are considered as being synchronized. When the signals are desynchronized, the control circuit 3 prevents synchronization of the generator G by means of signals C1 and C2.

This embodiment is more advantageous than the previous embodiments as it uses three synchronization sources, one of which is an internal synchronization source, here the generator G. It is therefore possible to rapidly ascertain a malfunction in an external source and also to synchronize the internal source over a large time period so long as the external sources are synchronized.

Figure 5:
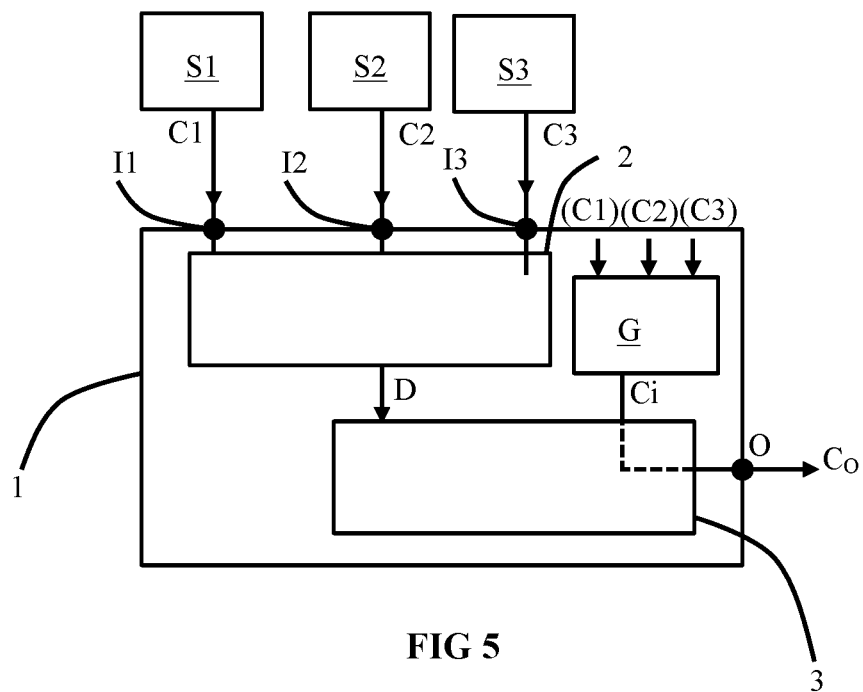
FIG. 5 illustrates an embodiment of a time arbitration circuit with three external synchronization sources, in schematic manner.

In another particular embodiment illustrated in FIG. 5, the comparator 3 comprises first, second and third inputs which are respectively connected to first, second and third sources S1, S2 and S3 which generate first, second and third clock signals C1, C2 and C3.

The comparator 2 is configured so as to provide a first data item D relative to the synchronization status of the different signals C1, C2 and C3 applied on input. As indicated in the foregoing, the comparator 2 can be configured to test all the signals applied on input two by two. As a variant, the comparator can be configured to test only two different pairs of signals.

The signal generator G is distinct from the first, second and third sources generating the three different clock signals C1, C2, C3.

In a particular and advantageous embodiment, one of the clock signal sources is a source internal to the time arbitration circuit 1. This internal source can be chosen from the examples of sources described in the above for the signal generator G.

The other two sources are advantageously external sources which are chosen from the examples of sources described in the foregoing. Advantageously, one of the sources receives a satellite signal and the other source receives a hard-wired signal, for example an NTP or PTP network synchronization signal. It is advantageous to choose a source originating from the device delivering a legal time.

It can be particularly advantageous to provide for the control circuit 3 to enable synchronization of the signal generator G with the signal present on the first input, on the second input or on the third input of the comparator 2 when the comparator 2 detects that the three signals are synchronized.

When the control circuit 3 detects a lack of synchronization between the different synchronization sources S1, S2 and S3, it decides to prevent synchronization of the generator G with these three sources. In this particular case, the clock signal generator is no longer servo-controlled and is said to be in "hold over" mode.

Figure 6:
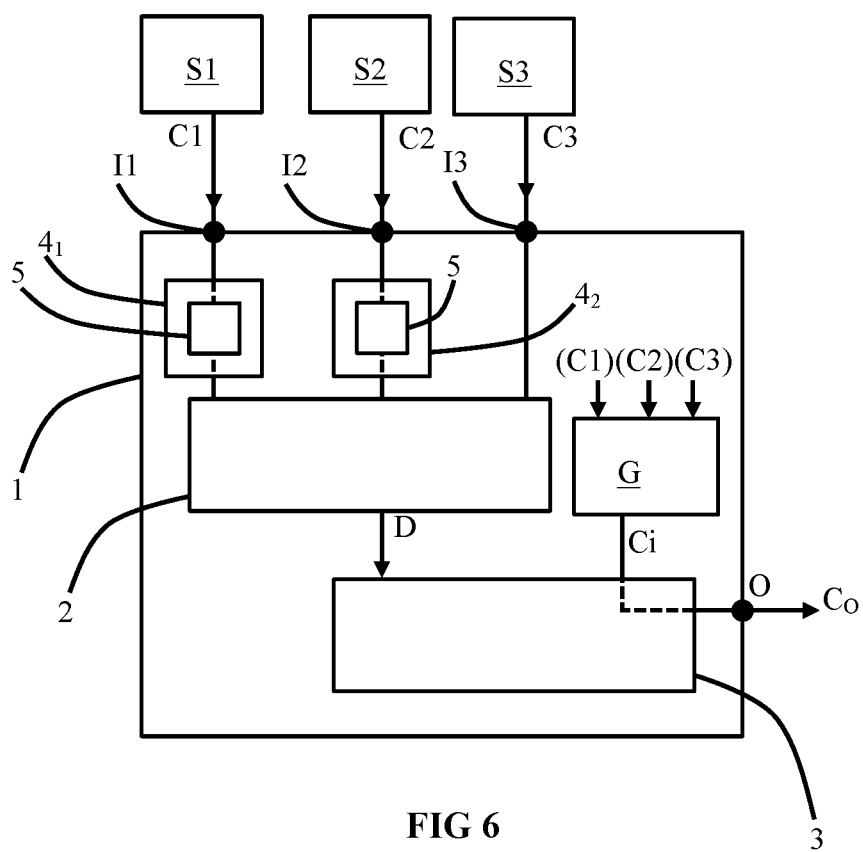
FIG. 6 illustrates an embodiment of a time arbitration circuit with three external synchronization sources and processing circuits, in schematic manner.

In a particular embodiment illustrated in FIG. 6, the time arbitration circuit 1 comprises a first processing circuit $4_1$ which is connected between the first input I1 of the time arbitration circuit 1 and the first input of the comparator 2.

In advantageous manner, the time arbitration circuit 1 also comprises a second processing circuit $4_2$ which is connected between the second input I2 of the time arbitration circuit 1 and the second input of the comparator 2.

To compare clock signals, the time arbitration circuit 1 is advantageously configured to use a pulse-per-signal signal. Comparison is performed by comparing several tops from several time sources. It is possible to deduce mean deviation values therefrom. However, this comparison can only be performed efficiently and instantaneously with good-quality signals.

The processing circuit $4_1$, $4_2$ comprises an oscillator 5 which is servo-controlled to the signal present on its associated input. The signal present on the input of the comparator 2 is therefore emitted from the oscillator 5 of the processing circuit $4_1$, $4_2$.

The signals emitted from external sources are often noisy. It is therefore particularly advantageous to use an oscillator 5 servo-controlled to the input signal in order to provide a more stable image of the input signal. This image will then be able to be compared with another signal in the comparator 2.

In a particular embodiment with at least two sources in addition to the generator G, when the control circuit 3 detects for example that the first and second signals C1 and C2 are no longer synchronized, the clock signal generator G is no longer servo-controlled. The clock signal generator G will then drift in known manner defined by its level of performance. It is then advantageous to use the signal delivered by the signal generator G and to compare it with the first signal C1 present on the first input I1 of the comparator 2 and with the second signal C2 present on the second input I2 of the comparator 2 in order to rapidly determine which of these two signals is polluted.

By comparing the signal emitted by the generator G with the different signals present on the inputs I1, I2 of the arbitration circuit, the control circuit 3 is easily able to determine which signal is polluted. The polluted signal is no longer taken into account and the other signal can be compared with the clock signal provided by the signal generator. The operating mode is then identical to the one described in FIG. 1 and presented in the foregoing. The control circuit 3 can be configured to search for the faulty synchronization source and to exclude it for example by comparing its signal with the signal from the internal generator.

If the time arbitration circuit 1 is connected to two external synchronization sources, it is advantageous not to synchronize the signal generator G with the external synchronization source which is kept. A slow and continuous drift of the external synchronization source will not in fact be detected by the arbitration circuit 1 and will be able to cause a slow and continuous drift of the output clock signal.

In the case where the time arbitration circuit 1 is initially connected to three different synchronization sources of the generator on the other hand, eliminating one of the synchronization sources does not prevent synchronization of the signal generator G with one or the other of the remaining sources as the two remaining sources can be tested to know whether they are synchronized or not.

For example, in a time arbitration circuit 1 configured to deliver an output clock signal $C_O$ having a precision of about 10 ns, the control circuit 3 can be configured to reject an input if its drift is about 5 ns over a time period of 400 seconds, which corresponds substantially to a drift of about 1 μs per day. Such a rejection rule corresponds to 50% of the exactitude limit of the time arbitration circuit 1. Once the control circuit detects that the synchronization signals are desynchronized, the control circuit analyses the deviation between the signal delivered by the generator G and the different signals present on the inputs. The signal presenting a drift of more than 4.5 ns after 400 seconds of observation is rejected. The circuit can detect if the inputs are not synchronized and it can also determine the input which is at fault.

In advantageous manner, the control circuit 3 is configured so that the observation time of the different signals with respect to the signal delivered by the generator G is sufficient to maintain 50% of the exactitude limit of the arbitration circuit 1. In this way, having tolerated an excursion equal to 50% of the exactitude limit of the arbitration circuit 1, it is possible to detect and to reject a polluted synchronization input without affecting the performance of the output signal expected by the user.

In advantageous manner, each input of the time arbitration circuit is considered independently.

In advantageous manner, the synchronization measurements between the different signals are made without modifying the generator G and/or the internal synchronization source which avoids gradually impairing the internal clock of the circuit 1 as the different measurements are made.

In advantageous manner, the different values of the first data item D, and the different values of the time differences between the sources if applicable, are recorded in a memory area (not shown). It is also possible to record the different actions performed on the generator G as well as on the other components constituting the time arbitration circuit 1. The data recorded in the memory area can be processed by the control circuit in order to trigger complementary actions.

In a particularly advantageous embodiment, the comparator is configured to perform continuous measurement of the synchronization between the different signals applied on input of the comparator, for example continuous measurement of the time difference between the different signals.

Continuous analysis of the different signals provides the user with a guarantee that he is using the output clock signal with the required precision.

When the control circuit 3 enables synchronization of the generator G with the signals coming from the synchronization sources, it is advantageous to perform continuous synchronization in order to avoid time jumps.

As a variant, when the control circuit 3 enables synchronization of the generator G with the signals coming from the synchronization sources, it is advantageous to perform synchronization in periodic manner in order to detect variations in the drift between the generator G and the synchronization sources S1, S2, S3.

In another variant, when the control circuit 3 enables synchronization of the generator G with the signals coming from the synchronization sources, it is advantageous to perform synchronization in random manner in order to guard against malevolent action which would make one of the synchronization sources vary slowly.

In advantageous manner, the control circuit 3 is configured to emit data representative of its operating mode and/or of detected errors or malfunctions. The control circuit 3 can be configured to enable emission of one or more of the following signals:
- the different sources are not synchronized,
- one of the synchronization sources is no longer emitting a signal or this source is emitting a signal which is not synchronized with the other sources,
- the arbitration circuit is searching for the non-synchronized signal,
- the generator is no longer servo-controlled to one of the external sources, i.e. to one of the signals present on its inputs,
- the arbitration circuit has excluded a synchronization source.

The invention claimed is:
1. Time arbitration circuit comprising:
a comparator comprising at least first and second inputs and configured to provide at least a first data item relative to a synchronization status of signals applied on the first and second inputs of the comparator, the synchronization status being determined by a variation of a time difference between the signals applied on the first and second inputs of the comparator over a predefined time period or a rate at which the time difference varies over the predefined time period,
a clock signal generator connected to an output terminal of the time arbitration circuit and delivering an output clock signal,
a control circuit configured to enable or disable delivery of the output clock signal on an output terminal of the time arbitration circuit according to the first data item from the comparator or to deliver data relative to the synchronization status according to the first data item, the first input of the comparator is connected to a first input terminal of the time arbitration circuit designed to be connected to a first source delivering a first clock signal, the second input of the comparator is designed to be connected to a second source delivering a second clock signal, wherein the second input of the comparator is connected to a second input terminal of the time arbitration circuit designed to be connected to a second source delivering a second clock signal different from the clock signal generator.

2. Time arbitration circuit according to claim 1, wherein the clock signal generator is connected to the second input of the comparator.

3. Time arbitration circuit according to claim 1, wherein a third input of the comparator is connected to the clock signal generator and wherein the control circuit is configured to:

allow synchronization of the clock signal generator with one of the signals applied on the first and second inputs of the comparator when the comparator provides at least a first data item indicating synchronization of the signals applied on the first and second inputs, preventing synchronization of the clock signal generator with one of the signals applied on the first and second inputs of the comparator when the comparator provides at least a first data item indicating non-synchronization of the signals applied on the first and second inputs.

4. Time arbitration circuit according to claim 1, wherein a third input of the comparator is designed to be connected to a third source delivering a third clock signal, and wherein the control circuit is configured to:

allow synchronization of the clock signal generator with one of the signals applied on the first, second and third inputs of the comparator when the comparator provides at least a first data item indicating synchronization of the signals applied on the first, second and third inputs, preventing synchronization of the clock signal generator with one of the signals applied on the first, second and third inputs of the comparator when the comparator provides at least a first data item indicating non-synchronization of the signals applied on the first, second and third inputs.

5. Time arbitration circuit according to claim 4, wherein the third source is chosen from quartz oscillators and atomic micro-oscillators.

6. Time arbitration circuit according to claim 3, wherein the clock signal generator is synchronized continuously with the first clock signal or the second clock signal when a time difference between the signals applied on the first and second inputs representative of synchronisation status does not reach the threshold value.

7. Time arbitration circuit according to claim 3, wherein the clock signal generator is synchronized at regular intervals with the first clock signal or the second clock signal when a time difference between the signals applied on the first and second inputs representative of synchronisation status does not reach the threshold value.

8. Time arbitration circuit according to claim 3, wherein the clock signal generator is synchronized at random intervals with the first clock signal or the second clock signal when a time difference between the signals applied on the first and second inputs does not reach the threshold value.

9. Time arbitration circuit according to claim 1, wherein the first data item is obtained by means of a time difference between the signals applied on the first and second inputs.

10. Time arbitration circuit according to claim 9, wherein the comparator is configured to perform continuous measurement of said time difference.

11. Time arbitration circuit according to claim 9, wherein a third input of the comparator is connected to the clock signal generator and wherein the control circuit is configured to:

allow synchronization of the clock signal generator with one of the signals applied on the first and second inputs of the comparator when the comparator provides at least a first data item indicating synchronization of the signals applied on the first and second inputs, preventing synchronization of the clock signal generator with one of the signals applied on the first and second inputs of the comparator when the comparator provides at least a first data item indicating non-synchronization of the signals applied on the first and second inputs, and wherein the first data item is obtained by means of the time difference between the signals applied on the first and third inputs and/or the time difference between the signals applied on the second and third inputs.

12. Time arbitration circuit according to claim 1, wherein the first input of the time arbitration circuit is connected to a first processing circuit comprising a processing oscillator, the first processing circuit being configured to servo-control the processing oscillator to the signal received on the first input of the time arbitration circuit so that the first processing circuit delivers a clock signal representative of the signal applied on the first input of the time arbitration circuit to the comparator.

13. Time arbitration circuit according to claim 1, wherein the clock signal generator is a quartz oscillator or an atomic oscillator made from a rubidium or caesium base.

14. Time arbitration circuit according to claim 1, wherein the comparator is formed by a plurality of elementary comparators, the comparators being arranged to compare all the inputs of the comparator two by two.

15. Device for providing a clock signal comprising an arbitration device according to claim 1 and wherein the first source is formed by one or more satellites, by a hard-wired connection or by a signal emitted by radio waves.

16. Time arbitration circuit according to claim 9, wherein a third input of the comparator is designed to be connected to a third source delivering a third clock signal, and wherein the control circuit is configured to:

allow synchronization the clock signal generator with one of the signals applied on the first, second and third inputs of the comparator when the comparator provides at least a first data item indicating synchronization of the signals applied on the first, second and third inputs, preventing synchronization of the clock signal generator with one of the signals applied on the first, second and third inputs of the comparator when the comparator provides at least a first data item indicating non-synchronization of the signals applied on the first, second and third inputs, and wherein the first data item is obtained by means of the time difference between the signals applied on the first and third inputs and/or the time difference between the signals applied on the second and third inputs.

17. Time arbitration circuit comprising:

a comparator comprising at least first and second inputs and configured to provide at least a first data item relative to a synchronization status of signals applied on the first and second inputs of the comparator, the synchronization status being determined by a variation of a time difference between the signals applied on the first and second inputs of the comparator over a predefined time period or a rate at which the time difference varies over the predefined time period,
a clock signal generator connected to an output terminal of the time arbitration circuit and delivering an output clock signal,
a control circuit configured to enable or disable delivery of the output clock signal on an output terminal of the time arbitration circuit according to the first data item from the comparator or to deliver data relative to the synchronization status according to the first data item,
the first input of the comparator is connected to a first input terminal of the time arbitration circuit designed to be connected to a first source delivering a first clock signal, and
the second input of the comparator is designed to be connected to a second source delivering a second clock signal,
wherein the control circuit is configured to stop delivery of the output clock signal if a time difference between the signals applied on the first and second inputs reaches the threshold value after a predefined time period started when the control circuit detects that the time difference has reached the threshold value.

18. Time arbitration circuit according to claim 17, wherein the clock signal generator is connected to the second input of the comparator or wherein the first data item is obtained by means of a time difference between the signals applied on the first and second inputs or wherein the first input of the time arbitration circuit is connected to a first processing circuit comprising a processing oscillator, the first processing circuit being configured to servo-control the processing oscillator to the signal received on the first input of the time arbitration circuit so that the first processing circuit delivers a clock signal representative of the signal applied on the first input of the time arbitration circuit to the comparator or wherein the clock signal generator is a quartz oscillator or an atomic oscillator made from a rubidium or caesium base or wherein the comparator is formed by a plurality of elementary comparators, the comparators being arranged to compare all the inputs of the comparator two by two.

19. Time arbitration circuit according to claim 17, wherein a third input of the comparator is connected to the clock signal generator and wherein the control circuit is configured to:
allow synchronization of the clock signal generator with one of the signals applied on the first and second inputs of the comparator when the comparator provides at least a first data item indicating synchronization of the signals applied on the first and second inputs, and
preventing synchronization of the clock signal generator with one of the signals applied on the first and second inputs of the comparator when the comparator provides at least a first data item indicating non-synchronization of the signals applied on the first and second inputs,
or wherein a third input of the comparator is designed to be connected to a third source delivering a third clock signal, and wherein the control circuit is configured to:
allow synchronization the clock signal generator with one of the signals applied on the first, second and third inputs of the comparator when the comparator provides at least a first data item indicating synchronization of the signals applied on the first, second and third inputs, and
preventing synchronization of the clock signal generator with one of the signals applied on the first, second and third inputs of the comparator when the comparator provides at least a first data item indicating non-synchronization of the signals applied on the first, second and third inputs.

* * * * *